United States Patent
Melanson (10) Patent No.: US 8,248,145 B2
(45) Date of Patent: Aug. 21, 2012

(54) CASCODE CONFIGURED SWITCHING USING AT LEAST ONE LOW BREAKDOWN VOLTAGE INTERNAL, INTEGRATED CIRCUIT SWITCH TO CONTROL AT LEAST ONE HIGH BREAKDOWN VOLTAGE EXTERNAL SWITCH

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 356 days.

(21) Appl. No.: 12/495,457

(22) Filed: Jun. 30, 2009

(65) Prior Publication Data
US 2010/0328976 A1 Dec. 30, 2010

(51) Int. Cl.
*H03K 17/60* (2006.01)
(52) U.S. Cl. ......... 327/432; 327/536; 323/222; 323/266
(58) Field of Classification Search .......... 323/222, 323/282–289, 266, 269, 312, 313, 271; 363/20, 363/21.04, 21.15, 21.18, 41, 89, 97, 59; 327/108, 327/333, 437, 465, 536, 538, 540, 375
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller et al. |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |
| 4,409,476 A | 10/1983 | Lofgren et al. |
| 4,414,493 A | 11/1983 | Henrich |
| 4,476,706 A | 10/1984 | Hadden et al. |
| 4,523,128 A | 6/1985 | Stamm |
| 4,677,366 A | 6/1987 | Wilkinson et al. |

(Continued)

FOREIGN PATENT DOCUMENTS

DE 19713814 10/1998
(Continued)

OTHER PUBLICATIONS

Mamano, Bob, "Current Sensing Solutions for Power Supply Designers", Unitrode Seminar Notes SEM1200, 1999.

(Continued)

*Primary Examiner* — Rajnikant Patel
(74) *Attorney, Agent, or Firm* — Hamilton & Terrile, LLP; Kent B. Chambers (57) ABSTRACT

An electronic system includes a low breakdown voltage (LBV) switch internal to an integrated circuit controller to control conductivity of an external, high breakdown voltage (HBV) switch. In at least one embodiment, the internal LBV switch and a cascode configuration of the LBV and HBV switches allow the controller to control the LBV switch and the HBV switch using an internal ("on-chip") control signal. In at least one embodiment, the LBV switch and the cascode configuration of the HBV switch also allows the controller to control the LBV and HBV switches with more accuracy and less parasitic losses relative to directly controlling the HBV switch. Thus, in at least one embodiment, the low breakdown voltage switch is fabricated as part of an integrated circuit controller, and the high breakdown voltage switch is fabricated separately and located external to the integrated circuit controller.

27 Claims, 6 Drawing Sheets

U.S. PATENT DOCUMENTS

| | | |
|---|---|---|
| 4,683,529 A | 7/1987 | Bucher |
| 4,700,188 A | 10/1987 | James |
| 4,737,658 A | 4/1988 | Kronmuller et al. |
| 4,797,633 A | 1/1989 | Humphrey |
| 4,937,728 A | 6/1990 | Leonardi |
| 4,940,929 A | 7/1990 | Williams |
| 4,973,919 A | 11/1990 | Allfather |
| 4,979,087 A | 12/1990 | Sellwood et al. |
| 4,980,898 A | 12/1990 | Silvian |
| 4,992,919 A | 2/1991 | Lee et al. |
| 4,994,952 A | 2/1991 | Silva et al. |
| 5,001,620 A | 3/1991 | Smith |
| 5,055,746 A | 10/1991 | Hu et al. |
| 5,109,185 A | 4/1992 | Ball |
| 5,121,079 A | 6/1992 | Dargatz |
| 5,206,540 A | 4/1993 | de Sa e Silva et al. |
| 5,264,780 A | 11/1993 | Bruer et al. |
| 5,278,490 A | 1/1994 | Smedley |
| 5,323,157 A | 6/1994 | Ledzius et al. |
| 5,359,180 A | 10/1994 | Park et al. |
| 5,383,109 A | 1/1995 | Maksimovic et al. |
| 5,424,932 A | 6/1995 | Inou et al. |
| 5,477,481 A | 12/1995 | Kerth |
| 5,479,333 A | 12/1995 | McCambridge et al. |
| 5,481,178 A | 1/1996 | Wilcox et al. |
| 5,565,761 A | 10/1996 | Hwang |
| 5,589,759 A | 12/1996 | Borgato et al. |
| 5,638,265 A | 6/1997 | Gabor |
| 5,646,832 A * | 7/1997 | Pulhamus et al. ............... 363/24 |
| 5,691,890 A | 11/1997 | Hyde |
| 5,747,977 A | 5/1998 | Hwang |
| 5,757,635 A | 5/1998 | Seong |
| 5,764,039 A | 6/1998 | Choi et al. |
| 5,768,111 A | 6/1998 | Zaitsu |
| 5,781,040 A | 7/1998 | Myers |
| 5,783,909 A | 7/1998 | Hochstein |
| 5,798,635 A | 8/1998 | Hwang et al. |
| 5,900,683 A | 5/1999 | Rinehart et al. |
| 5,912,812 A | 6/1999 | Moriarty, Jr. |
| 5,929,400 A | 7/1999 | Colby et al. |
| 5,946,202 A | 8/1999 | Balogh |
| 5,946,206 A | 8/1999 | Shimizu et al. |
| 5,952,849 A | 9/1999 | Haigh et al. |
| 5,960,207 A | 9/1999 | Brown |
| 5,962,989 A | 10/1999 | Baker |
| 5,963,086 A | 10/1999 | Hall |
| 5,966,297 A | 10/1999 | Minegishi |
| 5,994,885 A | 11/1999 | Wilcox et al. |
| 6,016,038 A | 1/2000 | Mueller et al. |
| 6,043,633 A | 3/2000 | Lev et al. |
| 6,072,969 A | 6/2000 | Yokomori et al. |
| 6,083,276 A | 7/2000 | Davidson et al. |
| 6,084,450 A | 7/2000 | Smith et al. |
| 6,091,233 A | 7/2000 | Hwang |
| 6,125,046 A | 9/2000 | Jang et al. |
| 6,150,774 A | 11/2000 | Mueller et al. |
| 6,181,114 B1 | 1/2001 | Hemena et al. |
| 6,211,627 B1 | 4/2001 | Callahan |
| 6,229,271 B1 | 5/2001 | Liu |
| 6,229,292 B1 | 5/2001 | Redl et al. |
| 6,246,183 B1 | 6/2001 | Buonavita |
| 6,259,614 B1 | 7/2001 | Ribarich et al. |
| 6,300,723 B1 | 10/2001 | Wang et al. |
| 6,304,066 B1 | 10/2001 | Wilcox et al. |
| 6,304,473 B1 | 10/2001 | Telefus et al. |
| 6,343,026 B1 | 1/2002 | Perry |
| 6,344,811 B1 | 2/2002 | Melanson |
| 6,369,525 B1 | 4/2002 | Chang et al. |
| 6,385,063 B1 | 5/2002 | Sadek et al. |
| 6,407,514 B1 | 6/2002 | Glaser et al. |
| 6,407,515 B1 | 6/2002 | Hesler |
| 6,407,691 B1 | 6/2002 | Yu |
| 6,441,558 B1 | 8/2002 | Muthu et al. |
| 6,445,600 B2 | 9/2002 | Ben-Yaakov |
| 6,452,521 B1 | 9/2002 | Wang |
| 6,462,963 B1 * | 10/2002 | Wittenbreder .................. 363/16 |
| 6,469,484 B2 | 10/2002 | L'Hermite et al. |
| 6,495,964 B1 | 12/2002 | Muthu et al. |
| 6,509,913 B2 | 1/2003 | Martin, Jr. et al. |
| 6,531,854 B2 | 3/2003 | Hwang |
| 6,580,258 B2 | 6/2003 | Wilcox et al. |
| 6,583,550 B2 | 6/2003 | Iwasa et al. |
| 6,628,106 B1 | 9/2003 | Batarseh et al. |
| 6,636,003 B2 | 10/2003 | Rahm et al. |
| 6,646,848 B2 | 11/2003 | Yoshida et al. |
| 6,657,417 B1 | 12/2003 | Hwang |
| 6,688,753 B2 | 2/2004 | Calon et al. |
| 6,713,974 B2 | 3/2004 | Patchornik et al. |
| 6,724,174 B1 | 4/2004 | Esteves et al. |
| 6,727,832 B1 | 4/2004 | Melanson |
| 6,737,845 B2 | 5/2004 | Hwang |
| 6,741,123 B1 | 5/2004 | Andersen et al. |
| 6,753,661 B2 | 6/2004 | Muthu et al. |
| 6,756,772 B2 | 6/2004 | McGinnis |
| 6,768,655 B1 | 7/2004 | Yang et al. |
| 6,781,351 B2 | 8/2004 | Mednik et al. |
| 6,788,011 B2 | 9/2004 | Mueller et al. |
| 6,806,659 B1 | 10/2004 | Mueller et al. |
| 6,839,247 B1 | 1/2005 | Yang |
| 6,860,628 B2 | 3/2005 | Robertson et al. |
| 6,870,325 B2 | 3/2005 | Bushell et al. |
| 6,873,065 B2 | 3/2005 | Haigh et al. |
| 6,882,552 B2 | 4/2005 | Telefus et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shteynberg et al. |
| 6,956,750 B1 | 10/2005 | Eason et al. |
| 6,958,920 B2 | 10/2005 | Mednik et al. |
| 6,963,496 B2 | 11/2005 | Bimbaud |
| 6,970,503 B1 | 11/2005 | Kalb |
| 6,975,523 B2 | 12/2005 | Kim et al. |
| 6,980,446 B2 | 12/2005 | Simada et al. |
| 7,003,023 B2 | 2/2006 | Krone et al. |
| 7,034,611 B2 | 4/2006 | Oswal et al. |
| 7,050,509 B2 | 5/2006 | Krone et al. |
| 7,064,531 B1 | 6/2006 | Zinn |
| 7,072,191 B2 | 7/2006 | Nakao et al. |
| 7,075,329 B2 | 7/2006 | Chen et al. |
| 7,078,963 B1 | 7/2006 | Andersen et al. |
| 7,088,059 B2 | 8/2006 | McKinney et al. |
| 7,099,163 B1 | 8/2006 | Ying |
| 7,102,902 B1 | 9/2006 | Brown et al. |
| 7,106,603 B1 | 9/2006 | Lin et al. |
| 7,109,791 B1 | 9/2006 | Epperson et al. |
| 7,126,288 B2 | 10/2006 | Ribarich et al. |
| 7,145,295 B1 | 12/2006 | Lee et al. |
| 7,158,633 B1 | 1/2007 | Hein |
| 7,161,816 B2 | 1/2007 | Shteynberg et al. |
| 7,180,250 B1 | 2/2007 | Gannon |
| 7,183,957 B1 | 2/2007 | Melanson |
| 7,221,130 B2 | 5/2007 | Ribeiro et al. |
| 7,233,135 B2 | 6/2007 | Noma et al. |
| 7,246,919 B2 | 7/2007 | Porchia et al. |
| 7,266,001 B1 | 9/2007 | Notohamiprodjo et al. |
| 7,276,861 B1 | 10/2007 | Shteynberg et al. |
| 7,288,902 B1 | 10/2007 | Melanson |
| 7,292,013 B1 | 11/2007 | Chen et al. |
| 7,310,244 B2 | 12/2007 | Yang et al. |
| 7,345,458 B2 | 3/2008 | Kanai et al. |
| 7,375,476 B2 | 5/2008 | Walter et al. |
| 7,378,912 B2 * | 5/2008 | Tanahashi et al. ............ 330/311 |
| 7,388,764 B2 | 6/2008 | Huynh et al. |
| 7,394,210 B2 | 7/2008 | Ashdown |
| 7,411,585 B2 * | 8/2008 | Kojima ........................ 345/204 |
| 7,511,437 B2 | 3/2009 | Lys et al. |
| 7,538,499 B2 | 5/2009 | Ashdown |
| 7,545,130 B2 | 6/2009 | Latham |
| 7,554,473 B2 | 6/2009 | Melanson |
| 7,569,996 B2 | 8/2009 | Holmes et al. |
| 7,583,136 B2 | 9/2009 | Pelly |
| 7,656,103 B2 | 2/2010 | Shteynberg et al. |
| 7,667,986 B2 | 2/2010 | Artusi et al. |
| 7,701,279 B2 * | 4/2010 | Scollo et al. .................. 327/433 |
| 7,710,047 B2 | 5/2010 | Shteynberg et al. |
| 7,719,246 B2 | 5/2010 | Melanson |
| 7,719,248 B1 | 5/2010 | Melanson |

| | | |
|---|---|---|
| 7,746,043 B2 | 6/2010 | Melanson |
| 7,746,671 B2 | 6/2010 | Radecker et al. |
| 7,750,738 B2 | 7/2010 | Bach |
| 7,756,896 B1 | 7/2010 | Feingold |
| 7,777,563 B2 | 8/2010 | Midya et al. |
| 7,804,256 B2 | 9/2010 | Melanson |
| 7,804,480 B2 | 9/2010 | Jeon et al. |
| 7,911,814 B2 * | 3/2011 | Tao et al. .................. 363/21.12 |
| 2002/0065583 A1 | 5/2002 | Okada |
| 2002/0145041 A1 | 10/2002 | Muthu et al. |
| 2002/0150151 A1 | 10/2002 | Krone et al. |
| 2002/0166073 A1 | 11/2002 | Nguyen et al. |
| 2003/0095013 A1 | 5/2003 | Melanson et al. |
| 2003/0174520 A1 | 9/2003 | Bimbaud |
| 2003/0223255 A1 | 12/2003 | Ben-Yaakov |
| 2004/0004465 A1 | 1/2004 | McGinnis |
| 2004/0046683 A1 | 3/2004 | Mitamura et al. |
| 2004/0085030 A1 | 5/2004 | Laflamme et al. |
| 2004/0085117 A1 | 5/2004 | Melbert et al. |
| 2004/0169477 A1 | 9/2004 | Yanai et al. |
| 2004/0227571 A1 | 11/2004 | Kuribayashi |
| 2004/0228116 A1 | 11/2004 | Miller et al. |
| 2004/0232971 A1 | 11/2004 | Kawasaki et al. |
| 2004/0239262 A1 | 12/2004 | Ido et al. |
| 2005/0057237 A1 | 3/2005 | Clavel |
| 2005/0156770 A1 | 7/2005 | Melanson |
| 2005/0168492 A1 | 8/2005 | Hekstra et al. |
| 2005/0184895 A1 | 8/2005 | Petersen et al. |
| 2005/0197952 A1 | 9/2005 | Shea et al. |
| 2005/0207190 A1 | 9/2005 | Gritter |
| 2005/0218838 A1 | 10/2005 | Lys |
| 2005/0222881 A1 | 10/2005 | Booker |
| 2005/0253533 A1 | 11/2005 | Lys et al. |
| 2005/0270813 A1 | 12/2005 | Zhang et al. |
| 2005/0275354 A1 | 12/2005 | Hausman, Jr. et al. |
| 2005/0275386 A1 | 12/2005 | Jepsen et al. |
| 2006/0002110 A1 | 1/2006 | Dowling |
| 2006/0022916 A1 | 2/2006 | Aiello |
| 2006/0023002 A1 | 2/2006 | Hara et al. |
| 2006/0116898 A1 | 6/2006 | Peterson |
| 2006/0125420 A1 | 6/2006 | Boone et al. |
| 2006/0184414 A1 | 8/2006 | Pappas et al. |
| 2006/0214603 A1 | 9/2006 | Oh et al. |
| 2006/0226795 A1 | 10/2006 | Walter et al. |
| 2006/0238136 A1 | 10/2006 | Johnson III et al. |
| 2006/0261754 A1 | 11/2006 | Lee |
| 2006/0285365 A1 | 12/2006 | Huynh et al. |
| 2007/0024213 A1 | 2/2007 | Shteynberg et al. |
| 2007/0029946 A1 | 2/2007 | Yu et al. |
| 2007/0040512 A1 | 2/2007 | Jungwirth et al. |
| 2007/0053182 A1 | 3/2007 | Robertson |
| 2007/0055564 A1 | 3/2007 | Fourman |
| 2007/0103949 A1 | 5/2007 | Tsuruya |
| 2007/0124615 A1 | 5/2007 | Orr |
| 2007/0126656 A1 | 6/2007 | Huang et al. |
| 2007/0182699 A1 | 8/2007 | Ha et al. |
| 2007/0285031 A1 | 12/2007 | Shteynberg et al. |
| 2008/0012502 A1 | 1/2008 | Lys |
| 2008/0027841 A1 | 1/2008 | Eder |
| 2008/0043504 A1 | 2/2008 | Ye et al. |
| 2008/0054815 A1 | 3/2008 | Kotikalapoodi et al. |
| 2008/0116818 A1 | 5/2008 | Shteynberg et al. |
| 2008/0130322 A1 | 6/2008 | Artusi et al. |
| 2008/0130336 A1 | 6/2008 | Taguchi |
| 2008/0150433 A1 | 6/2008 | Tsuchida et al. |
| 2008/0154679 A1 | 6/2008 | Wade |
| 2008/0174291 A1 | 7/2008 | Hansson et al. |
| 2008/0174372 A1 | 7/2008 | Tucker et al. |
| 2008/0175029 A1 | 7/2008 | Jung et al. |
| 2008/0192509 A1 | 8/2008 | Dhuyvetter et al. |
| 2008/0224635 A1 | 9/2008 | Hayes |
| 2008/0232141 A1 | 9/2008 | Artusi et al. |
| 2008/0239764 A1 | 10/2008 | Jacques et al. |
| 2008/0259655 A1 | 10/2008 | Wei et al. |
| 2008/0278132 A1 | 11/2008 | Kesterson et al. |
| 2009/0067204 A1 | 3/2009 | Ye et al. |
| 2009/0070188 A1 | 3/2009 | Scott et al. |
| 2009/0147544 A1 | 6/2009 | Melanson |
| 2009/0174479 A1 | 7/2009 | Yan et al. |
| 2009/0218960 A1 | 9/2009 | Lyons et al. |
| 2010/0141317 A1 | 6/2010 | Szajnowski |

FOREIGN PATENT DOCUMENTS

| | | |
|---|---|---|
| EP | 0585789 A1 | 3/1994 |
| EP | 0632679 | 1/1995 |
| EP | 0838791 | 4/1998 |
| EP | 0910168 A1 | 4/1999 |
| EP | 1014563 | 6/2000 |
| EP | 1164819 A | 12/2001 |
| EP | 1213823 A2 | 6/2002 |
| EP | 1460775 | 9/2004 |
| EP | 1528785 A | 5/2005 |
| EP | 2204905 A1 | 7/2010 |
| GB | 2069269 A | 8/1981 |
| JP | WO 2006/022107 A2 | 3/2006 |
| WO | W09725836 | 7/1997 |
| WO | 01/15316 A1 | 1/2001 |
| WO | 01/97384 A | 12/2001 |
| WO | 02/15386 A2 | 2/2002 |
| WO | WO0227944 | 4/2002 |
| WO | 02/091805 A2 | 11/2002 |
| WO | W02006013557 | 2/2006 |
| WO | 20061067521 A | 6/2006 |
| WO | WO2006135584 | 12/2006 |
| WO | 20071026170 A | 3/2007 |
| WO | 20071079362 A | 7/2007 |
| WO | W02008072160 | 6/2008 |
| WO | W020080152838 | 12/2008 |

OTHER PUBLICATIONS http://toolbarpdf.com/docs/functions-and-features-of-inverters.html printed on Jan. 20, 2011.

D. Hausman, Lutron, RTISS-TE Operation, Real-Time Illumination Stability Systems for Trailing-Edge (Reverse Phase Control) Dimmers, v. 1.0 Dec. 2004.

International Rectifier, Data Sheet No. PD60230 revC, IR1150(S)(PbF), uPFC One Cycle Control PFC IC Feb. 5, 2007.

Texas Instruments, Application Report SLUA308, UCC3817 Current Sense Transformer Evaluation, Feb. 2004.

Texas Instruments, Application Report SPRA902A, Average Current Mode Controlled Power Factor Correctiom Converter using TMS320LF2407A, Jul. 2005.

Unitrode, Design Note DN-39E, Optimizing Performance in UC3854 Power Factor Correction Applications, Nov. 1994.

Fairchild Semiconductor, Application Note 42030, Theory and Application of the ML4821 Average Currrent Mode PFC Controller, Aug. 1997.

Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct 31, 2003.

Fairchild Semiconductor, FAN4822, ZVA Average Current PFC Controller, Rev. 1.0.1 Aug. 10, 2001.

Fairchild Semiconductor, ML4821, Power Factor Controller, Rev. 1.0.2, Jun. 19, 2001.

Fairchild Semiconductor, ML4812, Power Factor Controller, Rev. 1.0.4, May 31, 2001.

Linear Technology, 100 Watt LED Driver, Linear Technology, 2006.

Fairchild Semiconductor, FAN7544, Simple Ballast Controller, Rev. 1.0.0, 2004.

Fairchild Semiconductor, FAN7532, Ballast Controller, Rev. 1.0.2, Jun. 2006.

Fairchild Semiconductor, FAN7711, Ballast Control IC, Rev. 1.0.2, Mar. 2007.

Fairchild Semiconductor, KA7541, Simple Ballast Controller, Rev. 1.0.3, 2001.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

International Search Report and Written Opinion for PCT/US2008/062384 dated Jan. 14, 2008.

S. Dunlap et al., Design of Delta-Sigma Modulated Switching Power Supply, Circuits & Systems, Proceedings of the 1998 IEEE International Symposium, 1998.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.

Prodic, Aleksandar, "Digital Controller for High-Frequency Rectifiers with Power Factor Correction Suitable for On-Chip Implementation," IEEE, US, 2007.

International Search Report and Written Opinion, PCT US20080062378, dated Feb. 5, 2008.

International Search Report and Written Opinion, PCT US20090032351, dated Jan. 29, 2009.

Erickson, Robert W. et al, "Fundamentals of Power Electronics," Second Edition, Chapter 6, Boulder, Co, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

International Search Report and Written Report PCT US20080062428 dated Feb. 5, 2008.

Prodic, A. et al, "Dead Zone Digital Controller for Improved Dynamic Response of Power Factor Preregulators," IEEE, 2003.

Freescale Semiconductor, Inc., Dimmable Light Ballast with Power Factor Correction, Design Reference Manual, DRM067, Rev. 1, Dec. 2005.

J. Zhou et al, Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.0 Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED Color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

J. Turchi, Four Key Steps to Design a Continuous Conduction Mode PFC Stage Using the NCP1653, on Semiconductor, Publication Order No. AND184ID, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp2ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, Vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, 2000 http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.
D. Rand et al, Issues, Models and Solutions for Triac Modulated Phase Dimming of LED Lamps, Power Electronics Specialists Conference, 2007.
Supertex Inc., HV9931 Unity Power Factor LED Lamp Driver, Application Note AN-H52, Mar. 7, 2007.
Supertex Inc., 56W Off-line LED Driver, 120VAC with PFC, 160V, 350mA Load, Dimmer Switch Compatible, DN-H05, Feb. 2007.
ST Microelectronics, Power Factor Corrector L6561, Jun. 2004.
Fairchild Semiconductor, Application Note 42047 Power Factor Correction (PFC) Basics, Rev. 0.9.0 Aug. 19, 2004.
M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.
M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.
Fairchild Semiconductor, FAN4800, Low Start-up Current PFC/PWM Controller Combos, Nov. 2006.
Fairchild Semiconductor, FAN4810, Power Factor Correction Controller, Sep. 24, 2003.
Fairchild Semiconductor, FAN4822, ZVS Average Current PFC Controller, Aug. 10, 2001.
Fairchild Semiconductor, FAN7527B, Power Factor Correction Controller, 2003.
Fairchild Semiconductor, ML4821, Power Factor Controller, Jun. 19, 2001.
Freescale Semiconductor, AN1965, Design of Indirect Power Factor Correction Using 56F800/E, Jul. 2005.
International Search Report for PCT/US2008/051072, mailed Jun. 4, 2008.
Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al, International Rectifier, Bridgeless PFC Implementation Using One Cycle Control Technique, 2005.
Linear Technology, LT1248, Power Factor Controller, Apr. 20, 2007.
On Semiconductor, AND8123/D, Power Factor Correction Stages Operating in Critical Conduction Mode, Sep. 2003.
On Semiconductor, MC33260, GreenLine Compact Power Factor Controller: Innovative Circuit for Cost Effective Solutions, Sep. 2005.
On Semiconductor, NCP1605, Enhanced, High Voltage and Efficient Standby Mode, Power Factor Controller, Feb. 2007.
On Semconductor, NCP1606, Cost Effective Power Factor Controller, Mar. 2007.
On Semiconductor, NCP1654, Product Review, Power Factor Controller for Compact and Robust, Continuous Conduction Mode Pre-Converters, Mar. 2007.
Philips, Application Note, 90W Resonant Smps with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
Stmicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, Vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al, An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al, An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEETransactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. L Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al, Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.

D.K.W. Cheng et al., A New Improved Boost Converter with Ripple Free Input Current Using Coupled Inductors, Power Electronics and Variable Speed Drives, Sep. 21-23, 1998.

B.A. Miwa et al., High Efficiency Power Factor Correction Using Interleaved Techniques, Applied Power Electronics Conference and Exposition, Seventh Annual Conference Proceedings, Feb. 23-27,1992.

Z. Lai et al., A Family of Power-Factor-Correction Controllers, Twelfth Annual Applied Power Electronics Conference and Exposition, vol. 1, Feb. 23, 1997-Feb. 27, 1997.

L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

Texas Instruments, Interleaving Continuous Conduction Mode PFC Controller, UCC28070, SLUS794C, Nov. 2007, revised Jun. 2009, Texas Instruments, Dallas TX.

Texas Instruments, 8-Pin Continuous Conduction Mode (CCM) PFC Controller, UCC28019A, SLUS828B, Dec. 2008, Revised Apr. 2009.

Allegro, A1442 Low Voltage Full Bridge Brushless DC Motor Driver with Hall Commutation and Soft-Switching, and Reverse Battery, Short Circuit, and Thermal Shutdown Protection, printed Mar. 27, 2009.

ST Datasheet L6562, Transition-Mode PFC Controller, 2005, STMicroelectronics, Geneva, Switzerland.

Maksimovic, Regan Zane and Robert Erickson, Impact of Digital Control in Power Electronics, Proceedings of 2004 International Symposium on Power Semiconductor Devices & Ics, Kitakyushu, , Apr. 5, 2010, Colorado Power Electronics Center, ECE Department, University of Colorado, Boulder, CO.

"HV9931 Unity Power Factor LED Lamp Driver, Initial Release", Supertex Inc., Sunnyvale, CA USA 2005.

An-H52 Application Note: "HV9931 Unity Power Factor Led Lamp Driver" Mar. 7, 2007, Supertex Inc., Sunnyvale, CA, USA.

Dustin Rand et al: "Issues, Models and Solutions for Triac Modulated Phase Dimming of LED Lamps" Power Electronics Specialists Conferrence, 2007. PESC 2007. IEEE, IEEE, P1, Jun. 1, 2007, pp. 1398-1404.

Spiazzi G et al: "Analysis of a High-Power Factor Electronic Ballast for High Brightness Light Emitting Diodes" Power Electronics Specialists, 2005 IEEE 36TH Conference on June 12, 2005, Piscatawa, NJ, USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search Report PCT/US2008/062387 dated Feb. 5, 2008.

Noon, Jim "UC3855A/B High Performance Power Factor Preregulator", Texas Instruments, SLUA146A, May 1996, Revised Apr. 2004.

International Search Report PCT/GB2006/003259 dated Jan. 12, 2007.

Written Opinion of the International Searching Authority PCT/US2008/056739 dated Dec. 3, 2008.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search Report PCT/US2008/062387 dated Jan. 10, 2008.

Data Sheet LT3496 Triple Output LED Driver, Linear Technology Corporation, Milpitas, CA 2007.

Linear Technology, News Release, Triple Output LED, LT3496, Linear Technology, Milpitas, CA, May 24, 2007.

Linear Technology, "Single Switch PWM Controller with Auxiliary Boost Converter," LT1950 Datasheet, Linear Technology, Inc. Milpitas, CA, 2003.

Yu, Zhenyu, 3.3V DSP for Digital Motor Control, Texas Instruments, Application Report SPRA550 dated Jun. 1999.

International Rectifier, Data Sheet No. PD60143-O, Current Sensing Single Channel Driver, El Segundo, CA, dated Sep. 8, 2004.

Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt//://focus.ti.com/lit/ml/slup169/slup169.pdf the whole document.

* cited by examiner

CASCODE CONFIGURED SWITCHING USING AT LEAST ONE LOW BREAKDOWN VOLTAGE INTERNAL, INTEGRATED CIRCUIT SWITCH TO CONTROL AT LEAST ONE HIGH BREAKDOWN VOLTAGE EXTERNAL SWITCH

BACKGROUND OF THE INVENTION

1. Field of the Invention

The present invention relates in general to the field of electronics, and more specifically to a system and method related to cascode configured switching using at least one low breakdown voltage internal, integrated circuit switch to control at least one high breakdown voltage external switch.

2. Description of the Related Art

Systems often modulate conductivity of one or more semiconductor-based switches to control current through the switches. For example, switching power converters utilize a switch to control conversion of alternating current (AC) voltages to direct current (DC) voltages or DC-to-DC. Switches are also often used to control regulated current devices such as light emitting diodes (LEDs). Semiconductor-based switches can be categorized as low voltage switches and high voltage switches relative to each other. For example, semiconductor-based switches have breakdown voltages. Breakdown occurs when a voltage greater than the breakdown voltage causes avalanche multiplication of carriers in the switch. For example, in at least one embodiment, the breakdown voltage of a complimentary metal oxide semiconductor (CMOS) field effect transistor (FET) refers to a maximum allowable drain-to-source voltage of the CMOS FET beyond which breakdown of the CMOS FET occurs. In at least one embodiment, the breakdown voltage of a bi-polar junction transistor (BJT) refers to a maximum allowable collector-to-emitter voltage of the BJT beyond which breakdown of the BJT occurs.

Figure 1:
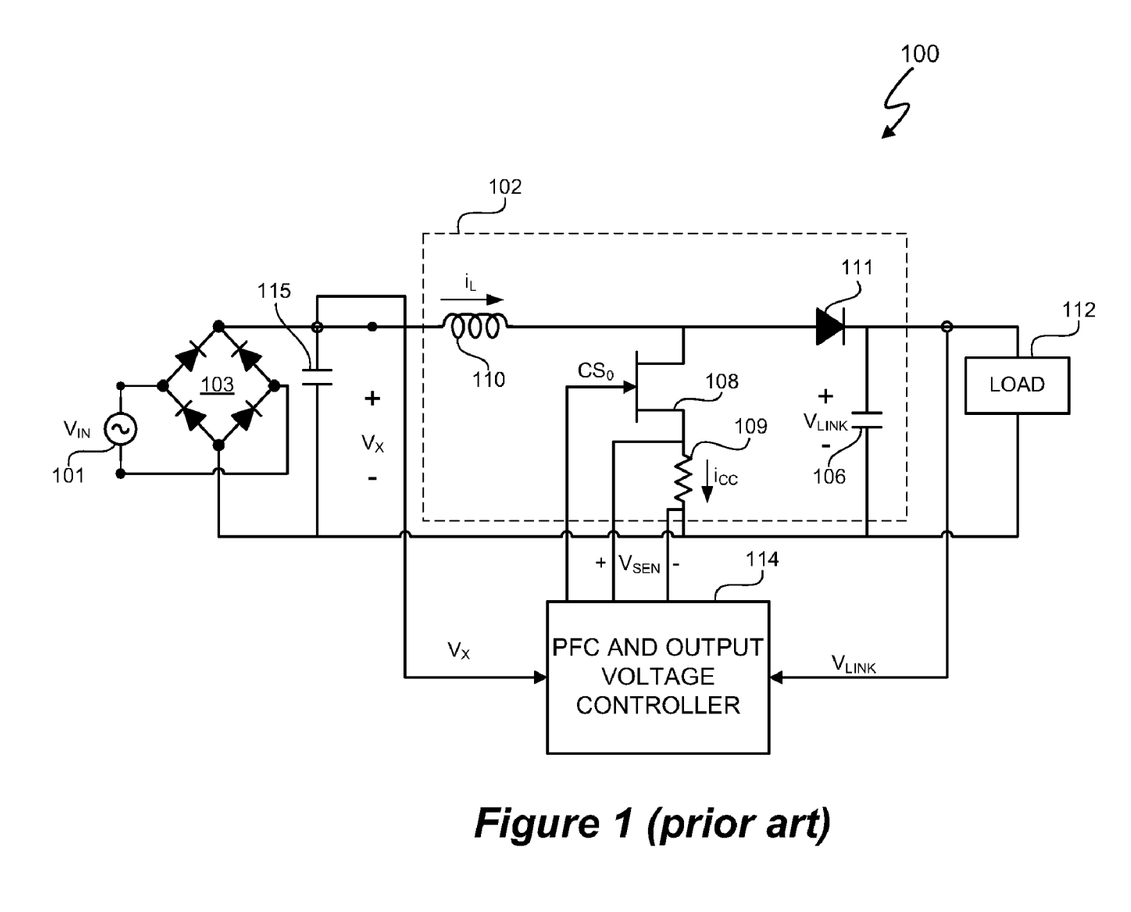
FIG. 1 (labeled prior art) depicts an electronic system having a switching power converter and a high voltage switch controlled by a pulse-width modulated control signal.

FIG. 1 represents a power control system 100, which includes switching power converter 102. In at least one embodiment, switching power converter operates in a continuous conduction mode (CCM). Voltage source 101 supplies an alternating current (AC) input voltage $V_{IN}$ to a full bridge diode rectifier 103. The voltage source 101 is, for example, a public utility, and the AC voltage $V_{IN}$ is, for example, a 60 Hz/110 V line voltage in the United States of America or a 50 Hz/220 V line voltage in Europe. The rectifier 103 rectifies the input voltage $V_{IN}$ and supplies a rectified, time-varying, line input voltage $V_X$ to the switching power converter.

The switching power converter 102 includes at least two switching operations, i.e. controlling field effect transistor (FET) 108 to provide power factor correction and controlling FET 108 to provide regulation of link voltage $V_{LINK}$. The inductor current $i_L$ ramps 'up' when FET 108 conducts, i.e. is "ON". The inductor current $i_L$ ramps down when FET 108 is nonconductive, i.e. is "OFF", and supplies current $i_L$ to recharge capacitor 106. The time period during which inductor current $i_L$ ramps down is commonly referred to as the "inductor flyback time". Diode 111 prevents reverse current flow into inductor 110. In at least one embodiment, control signal $CS_0$ is a pulse width modulated signal, and FET 108 is an n-channel FET. In this embodiment, control signal $CS_0$ is a gate voltage of FET 108, and FET 108 conducts when the pulse width of $CS_0$ is high. Thus, the 'on-time' of FET 108 is determined by the pulse width of control signal $CS_0$. In at least one embodiment, the switching power converter 102 operates in CCM, i.e. ramp up time of the inductor current $i_L$ plus the inductor flyback time is greater than or equal to the period of the control signal $CS_0$.

In at least one embodiment, switching power converter 102 boosts a 110-120 V rectified input voltage $V_X$ to a higher link voltage $V_{LINK}$, such as 200-400V. Accordingly, FET 108 is fabricated to have a breakdown voltage sufficient to accommodate the controlled current $i_{CCT}$ and voltage drops across FET 108 associated with the high input voltage $V_X$ and higher link voltage $V_{LINK}$. FET 108 is a high breakdown voltage device fabricated using a "high" voltage process. In at least one embodiment, FET 108 has a breakdown voltage greater than or equal to 30V and at least sufficient to accommodate operating characteristics of switching power converter 102. In at least one embodiment, power factor correction (PFC) and output voltage controller 114 is an integrated circuit and is fabricated using a low voltage process that is insufficient to fabricate a switch with a sufficiently high breakdown voltage to control the controlled current $i_{CCT}$. Thus, FET 108 is located external to PFC and output voltage controller 114. As subsequently described in more detail, PFC and output voltage controller 114 generates a pulse width modulated control signal $CS_0$ to control conductivity of FET 108. In at least one embodiment, FET 108 is a FET, and control signal $CS_0$ is a gate voltage.

Switching power converter 102 includes current sense resistor 109. Current sense circuit 109 can be any circuit that senses the switch controlled current $i_{CC}$. The switch controlled current $i_{CC}$ generates a sense voltage $V_{SEN}$ across current sense resistor 109. The PFC and output voltage controller 114 receives the sense voltage $V_{SEN}$. The resistance R of sense resistor 109 is known. The sense voltage $V_{SEN}$ is directly related to switch controlled current $i_{CC}$ via Ohm's law, i.e. $V_{SEN}=i_{CC} \cdot R$. "R" represents a resistance value of sense resistor 109, and the value of R is a matter of design choice. In at least one embodiment, PFC and output voltage controller 114 utilizes the sense voltage $V_{SEN}$ and sensing two signals, namely, the line input voltage $V_X$ and the capacitor voltage/output voltage $V_{LINK}$ to generate the pulse width and duty cycle of control signal $CS_0$.

Capacitor 106 supplies stored energy to load 112. The capacitor 106 is sufficiently large so as to maintain a substantially constant output voltage $V_{LINK}$, as established by a switch state controller 114 (as discussed in more detail below). The output voltage $V_{LINK}$ remains substantially constant during constant load conditions. However, as load conditions change, the output voltage $V_{LINK}$ changes. The switch state controller 114 responds to the changes in $V_{LINK}$ and adjusts the control signal $CS_0$ to restore a substantially constant output voltage as quickly as possible. The switch state controller 114 includes a small capacitor 115 to filter any high frequency signals from the line input voltage $V_X$.

The switch state controller 114 of power control system 100 controls FET 108 and, thus, controls power factor correction (PFC) and regulates output power of the switching power converter 102. The goal of power factor correction technology is to make the switching power converter 102 appear resistive to the voltage source 101. Thus, the switch state controller 114 attempts to control the inductor current $i_L$ so that the average inductor current $i_L$ is linearly and directly related to the line input voltage $V_X$. A CCM PFC controller, model number UCC28019A, available from Texas Instruments, Inc., Texas, USA is an example of switch state controller 114. The switch state controller 114 controls the pulse width (PW) and period (TT) of control signal $CS_0$. To regulate the amount of energy transferred and maintain a power factor close to one, switch state controller 114 varies the period of control signal $CS_0$ so that the input current $i_L$ tracks the changes in input voltage $V_X$ and holds the output voltage $V_{LINK}$ constant. Thus, as the input voltage $V_X$ increases, switch state controller 114 increases the period TT of control signal $CS_0$, and as the input voltage $V_X$ decreases, switch state controller 114 decreases the period of control signal $CS_0$. At the same time, the pulse width PW of control signal $CS_0$ is adjusted to maintain a constant duty cycle (D) of control signal $CS_0$, and, thus, hold the output voltage $V_{LINK}$ constant.

In at least one embodiment, the switch state controller 114 updates the control signal $CS_0$ at a frequency much greater than the frequency of input voltage $V_X$. The frequency of input voltage $V_X$ is generally 50-60 Hz. The frequency 1/TT of control signal $CS_0$ is, for example, between 20 kHz and 130 kHz. Frequencies at or above 20 kHz avoid audio frequencies and frequencies at or below 130 kHz avoid significant switching inefficiencies while still maintaining good power factor, e.g. between 0.9 and 1, and an approximately constant output voltage $V_{LINK}$.

As previously described, FET 108 is fabricated using a higher breakdown voltage process relative to a process used to fabricate PFC and output voltage controller 114. Accordingly, FET 108 is located external to PFC and output voltage controller 114 because the processes used to fabricate devices in PFC and output voltage controller 114 are incompatible with the process used to fabricate FET 108. Higher voltage switches have higher breakdown voltages. However, high voltage FET 108 has disadvantages relative to a low breakdown voltage switch. For example, relative to lower breakdown voltage switches, FET 108 requires more charge to change conduction state and has higher parasitic diode and capacitance related characteristics. Additionally, turning FET 108 "on" and "off" requires charging and discharging a gate of FET 108, and the charge on gate of FET 108 is discharged through a ground reference node and is therefore lost.

SUMMARY OF THE INVENTION

In one embodiment of the present invention, an apparatus includes an integrated circuit controller to at least control a switching power converter. The controller is configured to control the switching power converter by generating a switch control signal to control a first switch, wherein the first switch is internal to the controller. The integrated circuit includes a node to couple the first switch to a second switch in a cascode configuration. A breakdown voltage of the first voltage switch is approximately less than or equal to one-half of a breakdown voltage of the second switch.

In another embodiment of the present invention, a method includes generating a switch control signal and controlling conductivity of a first switch using the control signal. The method also includes controlling conductivity of a second switch of a switching power converter with the first switch. A breakdown voltage of the first switch is approximately less than or equal to one-half of a breakdown voltage of the second switch.

In a further embodiment of the present invention, an apparatus includes a switching power converter. The switching power converter includes a first switch to control an output voltage of the switching power converter. The apparatus also includes an integrated circuit controller, coupled to the first switch, to generate a switch control signal to control a second switch. The second switch is internal to the controller. The integrated circuit includes a node to couple the second switch to the first switch of the switching power converter in a cascode configuration. A breakdown voltage of the second switch is approximately less than or equal to one-half of a breakdown voltage of the first switch of the switching power converter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An electronic system includes a low breakdown voltage (LBV) switch internal to an integrated circuit controller to control conductivity of an external, high breakdown voltage (HBV) switch. In at least one embodiment, the internal LBV switch and a cascode configuration of the LBV and HBV switches allow the controller to control the LBV switch and the HBV switch using an internal ("on-chip") control signal. In at least one embodiment, the cascode configuration of the LBV switch and the HBV switch also allows the controller to control the LBV and HBV switches with more accuracy, less electromagnetic interference, and less parasitic losses relative to directly controlling the HBV switch. Additionally, in at least one embodiment, the electronic system is configured to allow charge on a node of the HBV switch to be at least partially recovered rather than discarded. Thus, in contrast to conventional technology, in at least one embodiment, the controller provides a switch control signal to the LBV switch, and the LBV switch controls conductivity of the HBV switch, rather than the controller providing the switch control signal directly to the HBV switch.

In at least one embodiment, the low breakdown voltage switch is fabricated as part of an integrated circuit controller, and the high breakdown voltage switch is fabricated separately and located external to the integrated circuit controller. The descriptive terms "internal" and "external" with reference to a switch refer to a location of the switch as being part of an integrated circuit, i.e. "on-chip", or separate from an integrated circuit, i.e. "off-chip". "High breakdown voltage" and "low breakdown voltage" are relative terms indicating, in at least one embodiment, a difference in breakdown voltages of the internal and external switches.

In at least one embodiment, the controller is configured to allow the internal, lower breakdown voltage switch to connect in series with the external, higher breakdown voltage switch in a cascode configuration. The controller controls conductivity of the internal switch, and conductivity of the internal switch controls conductivity of the external switch. Because the internal switch has a lower breakdown voltage than the high voltage switch, in at least one embodiment, the lower breakdown voltage switch costs less to manufacture, can be more precisely controlled, and has lower parasitic characteristics. The combination of the internal and external switches can be used in higher voltage operations, such as switching power conversion operations involving 110V and greater. The cascode configuration reduces conventional disadvantages of the high breakdown voltage switch by, for example, substantially reducing or eliminating some parasitic characteristics (such as Miller capacitance and parasitic diodes) and operational difficulties associated with the high breakdown voltage switch.

The cascoded internal, low breakdown voltage and external, high breakdown voltage switches can be used to control current in any load. For example, in at least one embodiment, the internal LBV switch is part of an integrated circuit controller configured to control a switching power converter, and the external HBV switch part of the switching power converter. In at least one embodiment, the internal and external cascoded switches can control current in a light emitting diode (LED) based light source or any other load.

In at least one embodiment, when the LBV and HBV switches are turned "on", current flows through the LBV and HBV switches. In at least one embodiment, the controller shapes the current to reduce certain detrimental effects, such as power losses and electromagnetic interference that can occur when, for example, the HBV switch is rapidly turned "on" without controlled shaping of the current. In at least one embodiment, the controller shapes the current by controlling a current magnitude versus time profile of the current.

In at least one embodiment, during operation of the LBV and HBV switches, a maximum operational voltage across any nodes of the LBV switch is less than a maximum operational voltage across any nodes of the HBV switch. In at least one embodiment, the maximum operational voltage across any nodes of the LBV switch is less than or equal to 30V, and the maximum operational voltage across any nodes of the HBV switch is greater than or equal to 60V.

Figure 2:
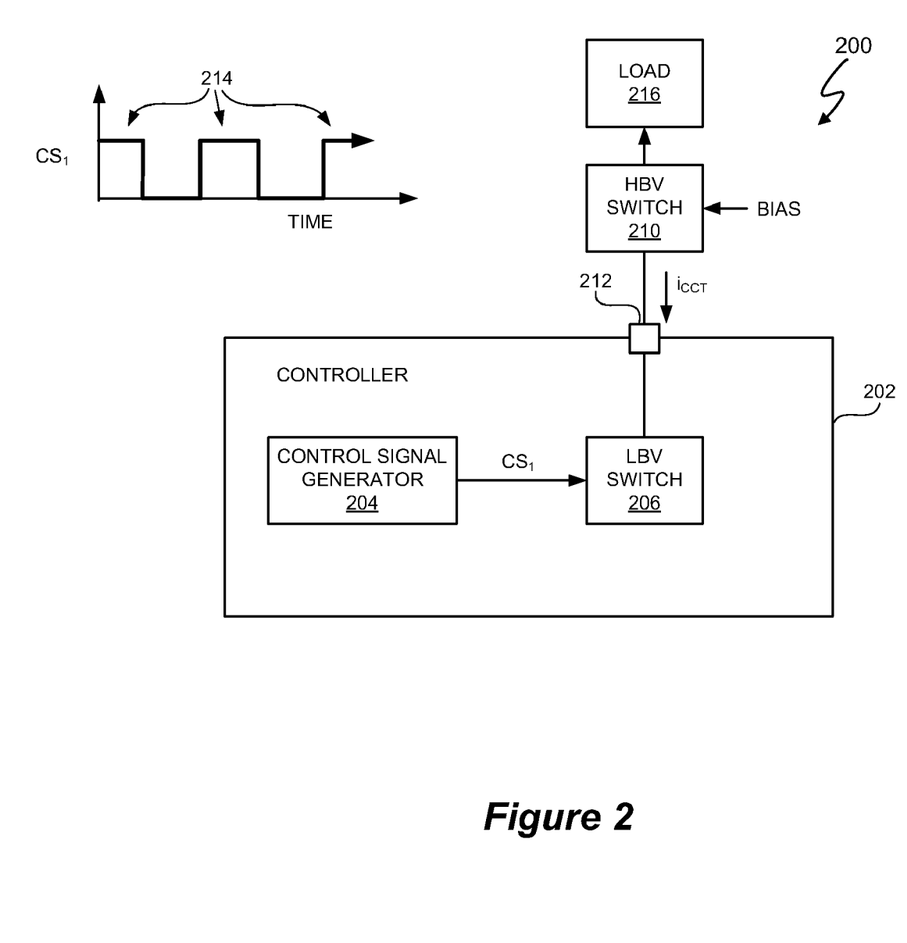
FIG. 2 depicts an electronic system having an integrated circuit that includes an internal switch to control an external switch in cascode configuration with the internal switch.

FIG. 2 depicts electronic system 200 that includes a controller 202 to control controlled current $i_{CCT}$. Controller 202 includes a control signal generator 204 to generate a control signal $CS_1$, and provide the control signal $CS_1$ to a control node of low breakdown voltage (LBV) switch 206 to control LBV switch 206. The control node of LBV switch 206 is a gate or a base for respective field effect transistor or bipolar transistor based implementations of LBV switch 206. Electronic system 200 also includes a high breakdown voltage (HBV) switch 210. In at least one embodiment, a control node of the HBV switch 210 does not receive a control signal from controller 202. The terms "low" and "high" used in relation to switches 206 and 210 are terms relative to switches 206 and 210 to indicate that switch 206 has a lower breakdown voltage $BV_{LOW}$ than switch 210, and therefore, switch 210 has a higher breakdown voltage $BV_{HIGH}$ than switch 206. In at least one embodiment, switch 206 has a breakdown voltage less than equal to one-half the breakdown voltage of switch 210, i.e. $BV_{LOW} \leq BV_{HIGH}/2$. In at least one embodiment, switch 206 has a breakdown voltage $BV_{LOW}$ equal to 30V or less, and switch 210 has a breakdown voltage $BV_{HIGH}$ of at least 60V, i.e. $BV_{LOW} \leq 30V$, and $BV_{HIGH} \geq 60V$. The particular type(s) of switches 206 and 210, such as bipolar or FET types, is (are) a matter of design choice. In at least one embodiment, switches 206 and 210 are semiconductor switches, each includes one or more field effect transistors (FETs) or one or more bipolar junction transistors (BJTs). HBV switch 210 can also include one or more insulated gate bipolar transistors (IBGTs). Switches 206 and 210 can be the same or different types.

In at least one embodiment, controller 202 is an integrated circuit. The internal LBV switch 206 allows control signal generator 204 to control LBV switch 206 using an internal ("on-chip") switch control signal $CS_1$. In at least one embodiment, directly controlling the internal LBV switch 206 with switch control signal allows controller 202 to indirectly control HBV switch 210 with more accuracy and less parasitic losses relative to directly controlling HBV switch 210 with control signal $CS_1$.

Controller 202 includes an exemplary node 212 to allow LBV switch 206 to connect in series with HBV switch 210 so that LBV switch 206 and HBV switch 210 are arranged in a cascode configuration. In at least one embodiment, node 212 is a conductive pad of controller 202. In a cascode configuration, HBV switch 210 represents a load to LBV switch 206, and LBV switch 206 controls conductivity of HBV switch 210. The cascoded configuration of LBV switch 206 and HBV switch 210 substantially reduces or eliminates some parasitic characteristics and operational difficulties associated with the higher breakdown voltage switch. Such parasitic characteristics can include Miller capacitance and parasitic diodes. Operational difficulties can include high turn-on current and high charge storage relative to lower breakdown voltage switches.

In at least one embodiment, controller 202 is implemented as an integrated circuit. In at least one embodiment, LBV switch 206 is fabricated as part of controller 202 and is, thus, internal to controller 202. In at least one embodiment, controller 202 is fabricated using a lower breakdown voltage process than a higher breakdown process used to fabricate HBV switch 210.

In at least one embodiment, control signal $CS_1$ is a duty cycle modulated signal having exemplary pulses 214. In at least one embodiment, HBV switch 210 is biased with a bias signal BIAS so that during a pulse of control signal $CS_1$, LBV switch 206 conducts and causes HBV switch 210 to conduct. Bias signal BIAS can be any signal that allows HBV switch 210 to conduct as controlled by LBV switch 206. For example, in some embodiments, HBV switch 210 is a FET, BJT, or IGBT, and the bias signal BIAS is respectively a gate voltage for a FET embodiment or a base voltage for a BJT or IGBT embodiment. In the cascode configuration, if HBV switch 210 is a FET, the gate is referred to herein as a bias node, and if HBV switch 210 is a BJT or IGBT, the base is referred to herein as a bias node. When switches 206 and 210 conduct (are "on"), controlled current $i_{CCT}$ flows through switches 206 and 210. The duty cycle of control signal $CS_1$ corresponds to an average resistance of switches 206 and 210 and, thus, corresponds to an average value of controlled current $i_{CCT}$. Accordingly, control signal $CS_1$ controls the average value of controlled current $i_{CCT}$. Controlled current $i_{CCT}$ flows through load 216. Load 216 can be any load utilizing controlled current $i_{CCT}$. For example, in at least one embodiment, load 216 is a switching power converter and a load connected to the switching power converter. In at least one embodiment, load 216 is a light source, such as an LED.

Control signal generator 204 generates control signal $CS_1$. The particular configuration of control signal generator 204 is a matter of design choice. In at least one embodiment, load 216 represents a switching power converter, and control signal generator generates control signal $CS_1$ to control power factor correction and output voltage regulation of load 216 as illustratively described in U.S. patent application Ser. No. 11/967,269, entitled Power Control System Using A Nonlinear Delta-Sigma Modulator With Nonlinear Power Conversion Process Modeling, filed on Dec. 31, 2007, inventor John L. Melanson, and assignee Cirrus Logic, Inc. U.S. patent application Ser. No. 11/967,269 is referred to herein as "Melanson I" and is hereby incorporated herein in its entirety.

Figure 3:
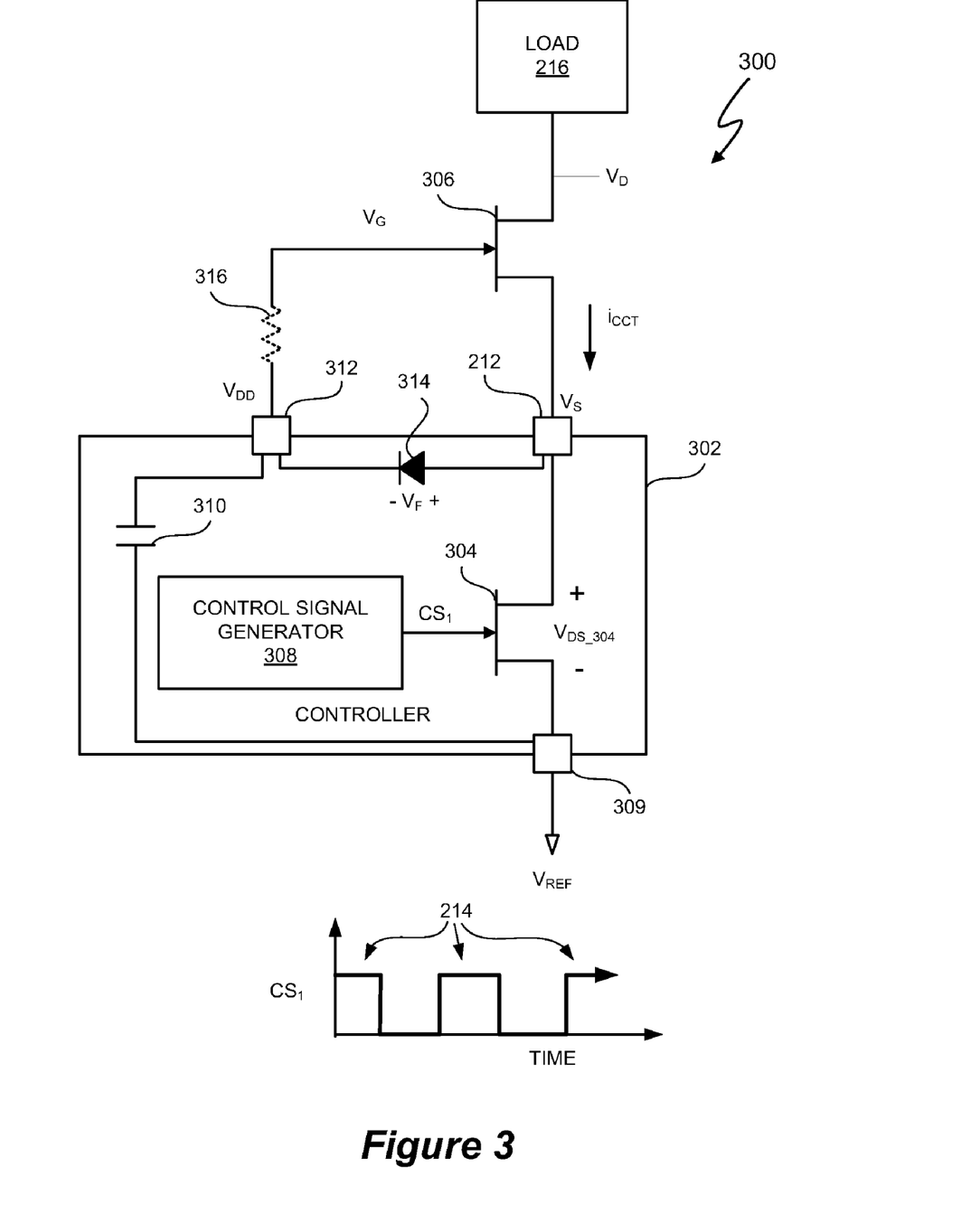
FIG. 3 depicts an embodiment of the electronic system of FIG. 2 with field effect transistors.

FIG. 3 depicts electronic system 300, which represents an exemplary embodiment of electronic system 200. Electronic system includes controller 302, and controller 302 includes n-channel LBV FET 304. In at least one embodiment, controller 302 is an integrated circuit. In at least one embodiment, LBV FET 304 is fabricated as part of controller 302 using a lower voltage process than a process used to fabricate HBV FET 306. Node 212 of controller 302 couples a drain of LBV FET 304 to a source of n-channel HBV FET 306. The source of LBV FET 304 is coupled to a reference voltage $V_{REF}$, such as a ground voltage, via node 309. In at least one embodiment, node 309 is a conductive pad of controller 302. Capacitor 310 is connected between node 312 and node 309. Capacitor 310 stores charge and can serve as an auxiliary power supply for devices connected to node 312.

Controller 302 receives a supply voltage $V_{DD}$ via node 312. In at least one embodiment, node 312 is a conductive pad of controller 302. Diode 314 connects node 212 to node 312. Diode 314 provides overvoltage protection at node 212 by ensuring that node 212 does not increase above $V_{DD}$ plus a forward voltage drop $V_F$ of diode 314 for any significant length time. Additionally, as subsequently explained in more detail, in at least one embodiment, the signal path through diode 314 between nodes 212 and 312 allow a voltage supply (not shown) supplying voltage $V_{DD}$ to recover some power when LBV FET 304 is turned "off". The gate of HBV FET 306 is coupled to node 312 and is biased by the gate voltage $V_G$. The gate of HBV FET 306 is either connected directly to node 312 and supply voltage $V_{DD}$ or is coupled to node 312 and supply voltage $V_{DD}$ via optional resistor 316. The supply voltage $V_{DD}$ provides a sufficient gate voltage for HBV FET 306 to allow HBV FET 306 to conduct when LBV FET 304 conducts. The particular value of supply voltage $V_{DD}$ is a matter of design choice and depends on, for example, the voltage specifications for controller 302 and loads driven by controller 302. In at least one embodiment, supply voltage $V_{DD}$ is +12V. In at least one embodiment, resistor 316 is connected between node 312 and the gate of HBV switch 306. Resistor 316 is shown in dashed lines as an optional component. When included in electronic system 300, resistor 316 assists in regulating a charging time of the gate of HBV FET 306 when HBV FET 306 turns "on". Regulating the charging time of the gate of HBV FET 306 can, for example, prevent conduction oscillations of HBV FET 306, control electromagnetic interference, and reduce switching power losses.

During operation of controller 302, control signal generator 308 generates a duty cycle modulated switch control signal $CS_1$. In at least one embodiment, control signal generator 308 is identical to control generator 204. During a pulse 214 of control signal $CS_1$, LBV FET 304 conducts. When LBV FET 304 conducts, the source of HBV FET 306 is coupled to the reference voltage $V_{REF}$, and current flows to the gate of HBV FET 306. The gate voltage $V_G$ minus the sum of the reference voltage $V_{REF}$ and a drain-to-source voltage $V_{DS\_304}$ is greater than a threshold voltage $V_{TH}$ of HBV FET 306, i.e. $V_G-(V_{DS\_304}+V_{REF})>V_{TH}$. Thus, when control signal $CS_1$ causes LBV FET 304 to conduct, the conduction of LBV FET 304 causes HBV FET 306 to also conduct. When switches 304 and 306 conduct, controlled current $i_{CCT}$ flows through switches 304 and 306.

When the pulse 214 of control signal $CS_1$ ends, LBV FET 304 turns "off". HBV FET 306 remains "on" until node 212 charges to at least $V_{DD}-V_{TH}$. In at least one embodiment, controlled current $i_{CCT}$ actually charges node 212 to a voltage $V_S$, which is above a sum of voltage $V_{DD}$ and the forward voltage drop $V_F$ of diode 314, i.e. $V_S>V_{DD}+V_F$. When $V_S>V_{DD}+V_F$. Thus, diode 314 is forward biased, and the controlled current $i_{CCT}$ actually provides charge to a voltage supply providing voltage $V_{DD}$ or to capacitor 310. Thus, in this embodiment, charge is recovered by the voltage supply (not shown) or stored by capacitor 310 rather than being discarded as with conventional systems, such as electronic system 100 (FIG. 1).

In at least one embodiment, LBV FET 304 and HBV FET 306 function as a symbiotic pair. In at least one embodiment, LBV FET 304 facilitates more accurate control of controlled current $i_{CCT}$ and reduces detrimental effects as previously discussed, and HBV FET 306 facilitates control of a high voltage circuit. When switches 304 and 306 are nonconductive, voltage $V_D-V_S$ is across HBV FET 306. In some embodiments, voltage $V_D-V_S$ is hundreds of volts, such as 400 V, which, in at least one embodiment, would exceed the breakdown voltage of LBV FET 304. The higher breakdown voltage $BV_{HIGH}$ of HBV FET 306 prevents breakdown of HBV FET 306. Diode 314 provides a discharge path from the drain of LBV FET 304 at node 212 to node 312, which prevents the voltage across LBV FET 304 from exceeding $V_S-V_{REF}$.

Figure 4:
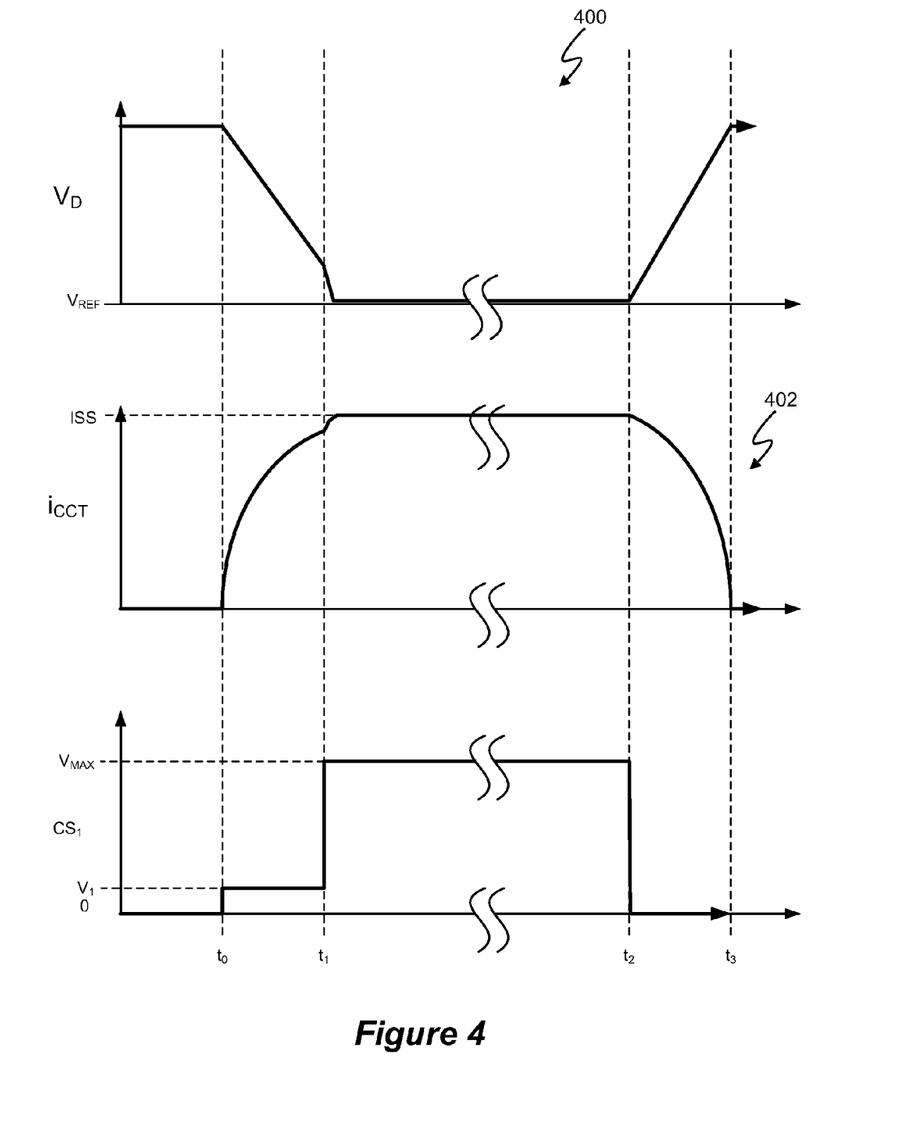
FIG. 4 depicts signal graphs for shaping a current in the electronic systems of FIGS. 2, 5, and 6.

FIG. 4 depicts signal graphs 400 of the drain voltage $V_D$ of HBV FET 306, the controlled current $i_{CCT}$, and switch control signal $CS_1$ in an embodiment that generates switch control signal $CS_1$ to shape controlled current $i_{CCT}$. Referring to FIGS. 3 and 4, in at least one embodiment, control signal generator 308 controls the rise of a pulse of switch control signal $CS_1$ to control the drain-to-source resistance of LBV FET 304 and, thus, shape the controlled current $i_{CCT}$ as indicated in the current magnitude versus time profile 402 of controlled current $i_{CCT}$. Shaping the controlled current $i_{CCT}$ controls the turn 'on' rate of HBV FET 306 by controlling a decrease in voltage at node 212 and, thus, controlling charging of the gate of HBV FET 306. In at least one embodiment, turning 'on' HBV FET 306 too slow wastes power, and turning 'on' HBV FET 306 too fast can increase electromagnetic interference and waste power in parasitic of HBV FET 306.

Referring to the signal graphs 400 and electronic system 300, when switch control signal $CS_1$ is 0V, the drain voltage $V_D$ of HBV FET 306 is 'high'. The 'high' value of the drain voltage depends on the operating environment of electronic system 300. At time $t_0$, control signal generator 308 begins a pulse of switch control signal $CS_1$. Between times $t_0$ and $t_1$, control signal generator 308 allows switch control signal $CS_1$ to rise to $V_1$. Between times $t_0$ and $t_1$, LBV FET 304 and HBV FET 306 have a "soft" turn 'on' so that the rate of increase of controlled current $i_{CCT}$ and the rate of decrease of drain voltage $V_D$ is less than the rates if switch control signal $CS_1$ pulses as depicted by pulses 214. At time $t_1$, control signal generator 308 causes switch control signal $CS_1$ to increase to a maximum voltage value $V_{MAX}$. Consequently, drain voltage $V_D$ decreases to approximately the reference voltage $V_{REF}$, and controlled current $i_{CCT}$ increases to a steady state value ISS.

At time $t_2$, switch control signal $CS_1$ drops to 0, thus, turning LBV FET 304 'off'. The controlled current $i_{CCT}$ decreases until node 212 sufficiently charges to turn HBV FET 306 'off' at time $t_3$. As controlled current $i_{CCT}$ decreases, the drain voltage $V_D$ increases until a steady state, maximum voltage is reached is reached at time $t_3$. The particular values of the drain voltage $V_D$ and the controlled current $i_{CCT}$ are functions of the particular circuit components used in electronic system 300. The particular timing of switch control signal $CS_1$ is a matter of design choice. In at least one embodiment, $t_1-t_0$ and $t_3-t_2$ are each 50 nanoseconds. The total duration, $t_3-t_0$, of a pulse of control signal $CS_1$ is determined by control signal generator 308 and, for example, depends on a desired average current value of controlled current $i_{CCT}$. In at least one embodiment, $t_3$–$t_0$ is approximately 5 microseconds. In signal graphs 400, the rise of control signal $CS_1$ is a step function between times $t_1$ and $t_0$. However, the rise function of control signal $CS_1$ is a matter of design choice. For example, the rise function can have one intermediate step $V_1$ between an initial value 0 and a final value $V_{MAX}$ of control signal $CS_1$ as shown in FIG. 4, can have multiple steps in a ramp function, can be a linear or non-linear continuous function rise, etc. The particular voltage levels of switch control signal $CS_1$ is also a design choice. In at least one embodiment, voltage $V_1$=1 to 1.25 V, and voltage $V_{MAX}$=12 V.

Figure 5:
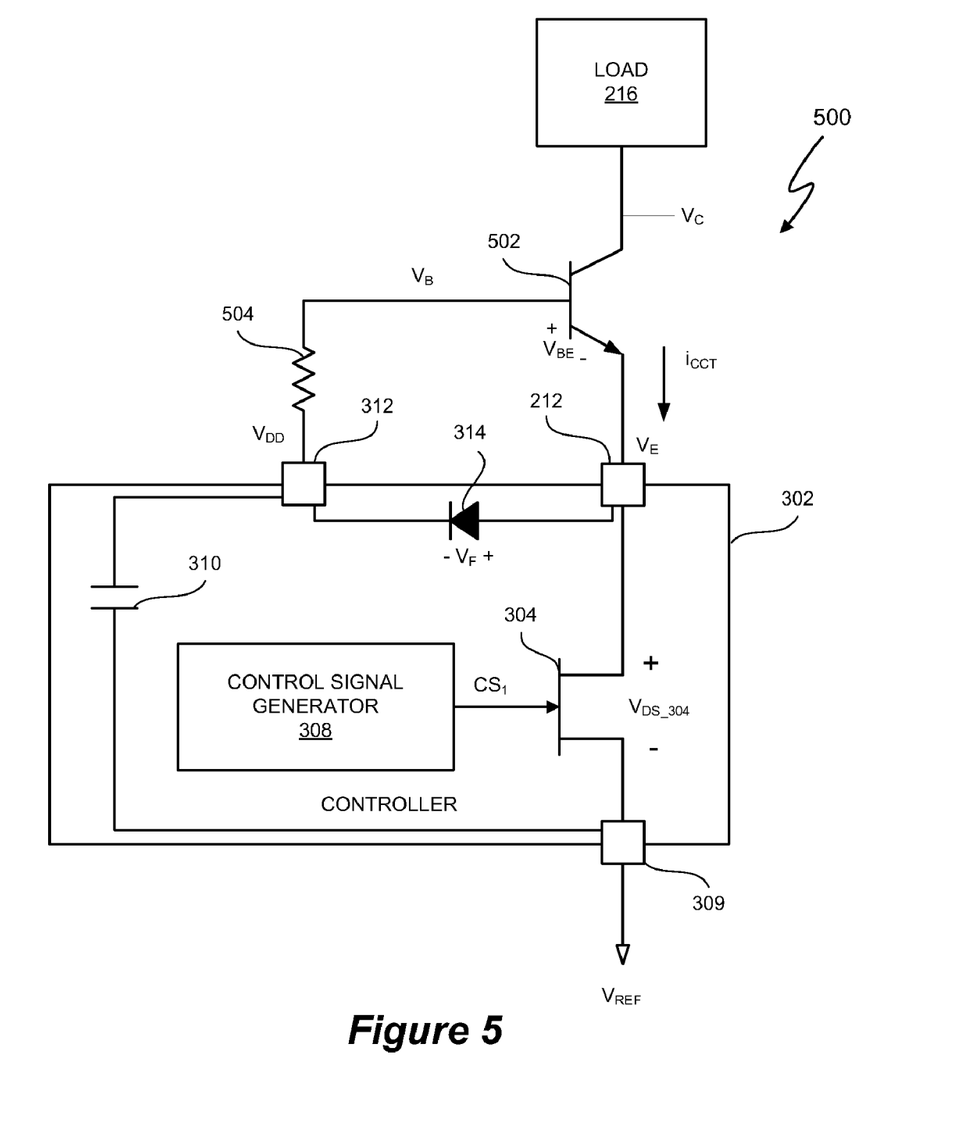
FIG. 5 depicts an embodiment of the electronic system of FIG. 2 with bipolar junction transistors.

FIG. 5 depicts electronic system 500, which represents an exemplary embodiment of electronic system 200. Electronic system 500 includes controller 302, and controller 302 includes LBV FET 304. Node 212 of controller 302 couples a drain of LBV FET 304 to an emitter of n-channel HBV BJT 502. In at least one embodiment, the source of LBV FET 304 is coupled to a reference voltage $V_{REF}$, such as a ground voltage.

During operation of controller 302, control signal generator 308 generates a duty cycle modulated switch control signal $CS_1$. In at least one embodiment, control signal generator 308 is identical to control signal generator 204. During a pulse 214 of control signal $CS_1$, LBV FET 304 conducts. The base of HBV BJT 502 is coupled to node 312 and held at base voltage $V_B$. When LBV FET 304 conducts, the emitter of HBV BJT 502 is coupled to the reference voltage $V_{REF}$, and the base voltage $V_B$ minus the sum of the reference voltage $V_{REF}$ and voltage $V_{DS\_304}$ is greater than the base-to-emitter voltage $V_{BE}$ to turn-on HBV BJT 502, i.e. $V_B$–($V_{DS\_304}$+$V_{REF}$)>$V_{BE\_ON}$, wherein $V_{BE\_ON}$ is the value of the base-to-emitter voltage $V_{BE}$ that allows controlled current $i_{CCT}$ to flow from the collector to the emitter of HBV BJT 502. Thus, when control signal $CS_1$ causes LBV FET 304 to conduct, the conduction of LBV FET 304 causes HBV BJT 502 to also conduct. The current into base of HBV BJT 502 is regulated by a current regulation circuit, such as resistor 504. For example, in the embodiment of electronic system 500 depicted in FIG. 5, resistor 504 assists in regulating a current flowing into the base of HBV FET HBV BJT 502 when HBV BJT 502 turns "on".

When switches 304 and 502 conduct, controlled current $i_{CCT}$ flows through switches 304 and 502. When switch control signal $CS_1$ turns LBV FET 304 'off', the controlled current $i_{CCT}$ charges node 212 until HBV BJT 502 turns 'off'. Diode 314 provides a discharge path to node 212 if the voltage of node 212 increases above the sum of the forward voltage $V_F$ of diode 314 and voltage $V_{DD}$. When switches 304 and 502 are nonconductive, voltage $V_{CE}$=$V_C$–$V_E$ is across HBV FET 306. "Voltage $V_C$" is the collector voltage of HBV BJT 502, and "voltage $V_E$" is the emitter voltage of HBV BJT 502. In some embodiments, collector voltage $V_C$ is hundreds of volts, such as 400 V. The higher breakdown voltage $BV_{HIGH}$ of HBV BJT 502 prevents breakdown of HBV BJT 502. By providing a discharge path to node 312, diode 314 prevents the voltage across LBV FET 304 from exceeding supply voltage $V_{DD}$+ the forward voltage $V_F$ of diode 314—the reference voltage $V_{REF}$, i.e. $V_{DS\_304}$≦($V_{DD}$+$V_F$)–$V_{REF}$. The breakdown voltage of LBV FET 304 is greater than ($V_{DD}$+$V_F$)–$V_{REF}$. Electronic system 500 can also generate switch control signal $CS_1$ to shape controlled current $i_{CCT}$ as previously described with reference to FIGS. 3 and 4.

Figure 6:
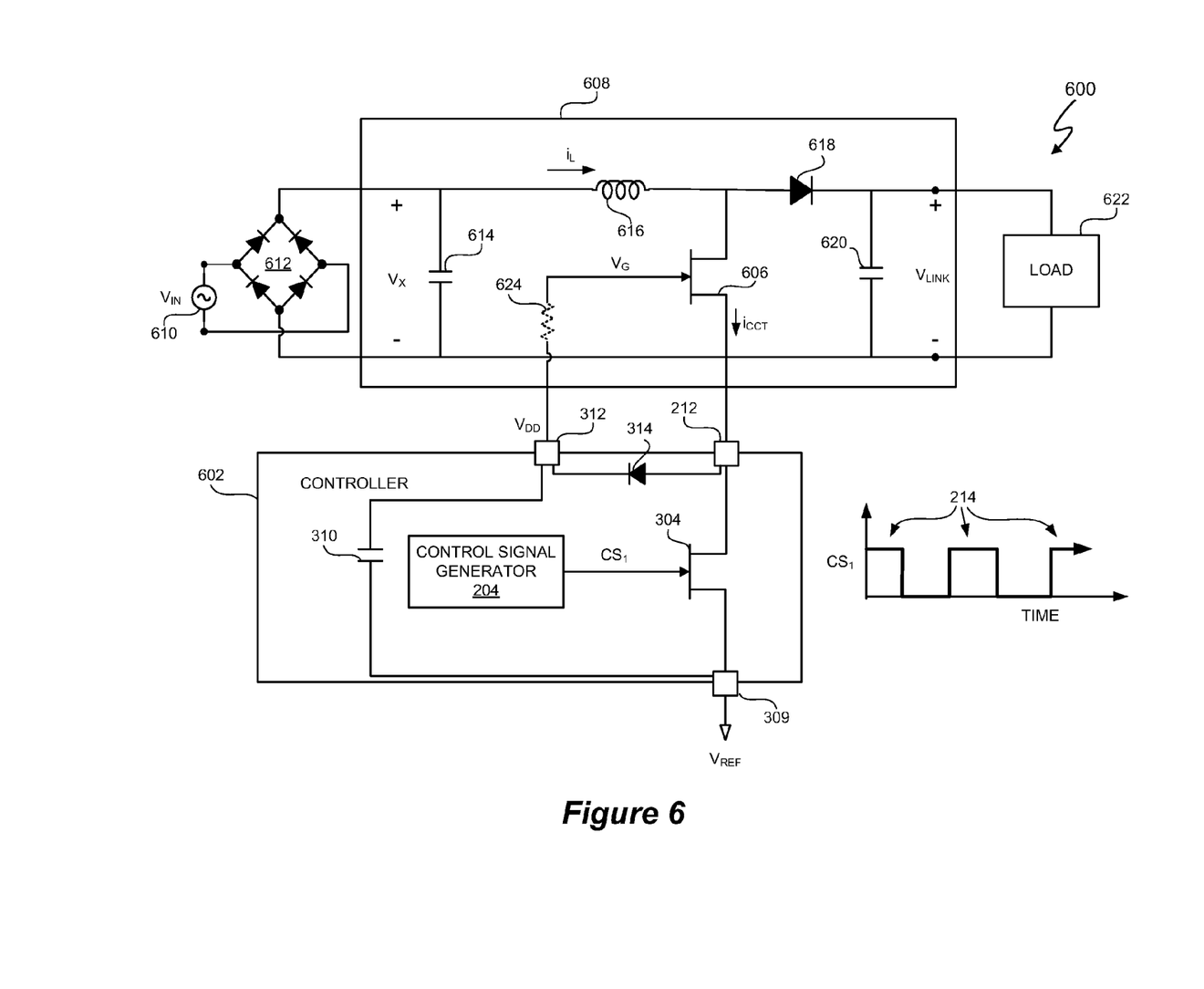
FIG. 6 depicts an embodiment of the electronic system of FIG. 2 with a switching power converter load.

FIG. 6 depicts electronic system 600, which represents one embodiment of electronic system 200. Electronic system 600 includes an integrated circuit controller 602, and controller 602 includes a LBV FET 304. Electronic system 600 also includes HBV FET 606 arranged in a cascode configuration with LBV FET 304. The internal LBV FET 304 allows control signal generator 204 to control LBV FET 304 using an internal switching power converter switch control signal $CS_1$. The LBV FET 304 and the cascode configuration of LBV FET 304 and HBV FET 606 allow controller 602 to control LBV FET 304 and HBV FET 606 with more accuracy and less parasitic losses relative to directly controlling HBV FET 606 with control signal $CS_1$. In at least one embodiment, the cascode arrangement of LBV FET 304 and HBV FET 606 allows controller 602 to more accurately control current $i_{CCT}$ because the internal LBV FET 304 is more responsive to control signal $CS_1$. The cascode arrangement of LBV FET 304 and HBV FET 606 has less parasitic losses, such as Miller capacitance losses. In at least one embodiment, a controlled turn "on" of HBV FET 606 can be especially valuable when switching power converter 608 operates in continuous conduction mode (CCM) because, in at least one embodiment, a reverse recovery of diode 618 can cause noise and power loss if switched too rapidly. Controlled switching of LBV FET 304 and HBV FET 606 can also minimize electromagnetic interference and switching power loss as previously described.

In at least some embodiments, LBV FET 304 is a FET or a BJT, such as respective LBV FET 304 (FIG. 3) or LBV BJT 404 (FIG. 4). In at least some embodiments, HBV FET 606 is a FET or a BJT, such as respective LBV FET 306 (FIG. 3) or HBV BJT 406 (FIG. 4). In at least one embodiment, implementing switch 606 as an NPN bipolar transistor in cascode configuration with LBV FET 304, allows switch 606 to have a higher breakdown voltage and less degradation due to leakage effects versus a FET implementation.

Electronic system 600 also includes switching power converter 608. Voltage supply 610 provides an AC supply voltage $V_{IN}$. In at least one embodiment, voltage supply 610 is identical to voltage supply 101. Full-bridge diode rectifier 612 rectifies the supply voltage $V_{IN}$ to generate input voltage $V_X$. Capacitor 614 provides high frequency filtering. During a pulse 214 of control signal $CS_1$, LBV FET 304 conducts and discharges node 616 towards reference voltage $V_{REF}$. Voltage $V_G$ biases a gate of HBV FET 606 so that when node 616 discharges towards reference voltage $V_{REF}$, HBV FET 606 conducts. Thus, the internal LBV FET 304 controls conduction of HBV FET 606. As previously discussed, diode 314 provides, for example, a discharge path for node 212 to recover charge from controlled current $i_{CCT}$ when LBV FET 304 is turned 'off' and to provide voltage protection for LBV FET 304.

When switches 304 and 606 conduct, controlled current $i_{CCT}$ equals the inductor current $i_L$, diode 618 is reverse biased, and the inductor current $i_L$ increases a voltage across inductor 616. When the pulse 214 of control signal $CS_1$ ends, FET 304 and, thus, FET 606 turn "off", diode 618 is forward biased, and inductor current $i_L$ charges capacitor 620. Control signal generator 204 generates control signal $CS_1$ with a sufficiently high frequency to provide power factor correction for switching power converter 608 and regulate link voltage $V_{LINK}$ to an approximately constant value. Switching power converter 608 provides the link voltage to load 622. Load 622 can be any load. Electronic system 600 can also generate switch control signal $CS_1$ to shape controlled current $i_{CCT}$ as previously described with reference to FIGS. 3 and 4. Resistor 624 is shown in dashed lines as an optional component. When included in electronic system 600, resistor 624 assists in regulating a charging time of the base of HBV FET 606 to voltage $V_{DD}$ when HBV FET 606 turns "on". Regulating the charging time of the base of HBV FET 606 can, for example, prevent conduction oscillations of HBV FET 606.

Thus, an electronic system includes an internal ("on-chip") LBV switch of an integrated circuit controller in cascode configuration with an external ("off-chip") HBV switch. The internal LBV switch allows a control signal generator of the controller to control the LBV switch using an internal control signal to, for example, provide more responsiveness of a controlled current to the internal control signal relative to using the control signal to drive the external HBV switch. In at least one embodiment, as previously, illustratively described, the LBV switch and the cascode configuration of the LBV switch and HBV switch allow the controller to control the LBV switch and the HBV switch with more accuracy and less parasitic losses relative to directly controlling the HBV switch with the controller.

Although the present invention has been described in detail, it should be understood that various changes, substitutions and alterations can be made hereto without departing from the spirit and scope of the invention as defined by the appended claims.

What is claimed is:

1. An apparatus comprising:
an integrated circuit controller to at least control a switching power converter, wherein the controller is configured to control the switching power converter by generating a switch control signal to control a first switch, wherein the first switch is internal to the controller, the integrated circuit includes a node to couple the first switch to a second switch in a cascode configuration, a breakdown voltage of the first voltage switch is approximately less than or equal to one-half of a breakdown voltage of the second switch; a first node to couple to a voltage supply; and a second node to couple to the first switch and the second switch; and
a charge recovery circuit coupled between the first node and the second node to provide charge recovery to the voltage supply during at least a portion of a time when the control signal turns the first switch off.

2. The apparatus of claim 1 wherein:
the first switch comprises a switch selected from a group consisting of a field effect transistor, a bipolar junction transistor, and an insulated gate bipolar transistor; and
the second switch comprises a switch selected from a group consisting of a field effect transistor, a bipolar junction transistor, and an insulated gate bipolar transistor.

3. The apparatus of claim 1 wherein the first switch and the second switch are identical types.

4. The apparatus of claim 1 wherein the first switch and the second switch are different types.

5. The apparatus of claim 1 wherein the controller is configured to control power factor correction of the switching power converter.

6. The apparatus of claim 1 wherein the controller is configured to generate the control signal to shape current in the switches.

7. The apparatus of claim 6 wherein the controller is configured to generate one or more intermediate steps of the switch control signal between an initial and final value of a pulse of the control signal to control the increase of the current in the switches.

8. The apparatus of claim 1 wherein the charge recovery circuit is a diode, and the diode is included in the integrated circuit.

9. The apparatus of claim 8 wherein the first node is also for coupling to a bias node of the second switch.

10. The apparatus of claim 1 wherein the breakdown voltage of the first switch is approximately less than or equal to 30 V and the breakdown voltage of the second switch is approximately greater than or equal to 60 V.

11. A method comprising:
generating a switch control signal;
controlling conductivity of a first switch using the control signal;
controlling conductivity of a second switch of a switching power converter with the first switch; and
providing charge recovery from a node coupled between the first and second switches to a voltage supply during at least a portion of a time when the control signal turns the first switch off;
wherein a breakdown voltage of the first switch is approximately less than or equal to one-half of a breakdown voltage of the second switch.

12. The method of claim 11 wherein generating the switch control signal comprises generating the switch control signal with an integrated circuit controller, and the integrated circuit controller includes the first switch.

13. The method of claim 11 further comprising:
controlling power factor correction and output voltage regulation of a switching power converter using the switch control signal.

14. The method of claim 11 wherein:
the first switch comprises a switch selected from a group consisting of a field effect transistor, a bipolar junction transistor, and an insulated gate bipolar transistor; and
the second switch comprises a switch selected from a group consisting of a field effect transistor, a bipolar junction transistor, and an insulated gate bipolar transistor.

15. The method of claim 11 wherein the first switch and the second switch are identical types.

16. The method of claim 11 wherein the first switch and the second switch are different types.

17. The method of claim 11 wherein the first switch comprises a bipolar junction transistor and the second switch comprises a bipolar junction transistor.

18. The method of claim 11 wherein generating the switch control signal further comprises:
generating the control signal to shape current in the switches.

19. The method of claim 18 wherein generating the switch control signal further comprises:
generating one or more intermediate steps of the switch control signal between an initial and final value of a pulse of the control signal to control the increase of the current in the switches.

20. The method of claim 11 further comprising:
discharging a node coupled between the first switch and the second switch to a power supply after the low and second switches are turned "off" by the switch control signal.

21. The method of claim 11 wherein the breakdown voltage of the first switch is approximately less than or equal to 30 V and the breakdown voltage of the second switch is approximately greater than or equal to 60 V.

22. An apparatus comprising:
a switching power converter having a first switch to control an output voltage of the switching power converter; and
an integrated circuit controller, coupled to the first switch, to generate a switch control signal to control a second switch, wherein the second switch is internal to the controller, the integrated circuit includes a node to couple the second switch to the first switch of the switching power converter in a cascode configuration, a breakdown voltage of the second switch is approximately less than or equal to one-half of a breakdown voltage of the first switch of the switching power converter; a first node to couple to a voltage supply; and a second node to couple to the first switch and the second switch; and a charge recovery circuit coupled between the first node and the second node to provide charge recovery to the voltage supply during at least a portion of a time when the control signal turns the first switch off.

23. The apparatus of claim 22 wherein the controller is configured to generate one or more intermediate steps of the switch control signal between an initial and final value of a pulse of the control signal to control the rise of the current in the switches.

24. The method of claim 11 wherein providing charge recovery to the voltage supply during at least a portion of the time when the control signal turns the first switch off comprises:

discharging a diode coupled between the first and second switches to provide charge recovery to the voltage supply during at least a portion of the time when the control signal turns the first switch off.

25. The apparatus of claim 1 wherein the controller is further configured to generate the switch control signal with at least two discrete states to cause the first switch to conduct less current during a first of the at least two discrete states than during a subsequent second state of the with at least two current resistance states.

26. The method of claim 11 wherein controlling conductivity of a first switch using the control signal comprises controlling conductivity of the first switch with at least two conductive discrete states to cause the first switch to conduct less current during a first of the at least two discrete states than during a subsequent second state of the with at least two current resistance states.

27. The apparatus of claim 22 wherein the controller is further configured to generate the switch control signal with at least two discrete states to cause the first switch to conduct less current during a first of the at least two discrete states than during a subsequent second state of the with at least two current resistance states.

* * * * *